United States Patent
Tsai et al.

(10) Patent No.: US 8,861,281 B2
(45) Date of Patent: Oct. 14, 2014

(54) METHOD OF PROGRAMMING MEMORY AND MEMORY APPARATUS UTILIZING THE METHOD

(75) Inventors: Ping-Hung Tsai, Hsinchu (TW); Jyun-Siang Huang, Hsinchu (TW); Wen-Jer Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 543 days.

(21) Appl. No.: 13/105,276

(22) Filed: May 11, 2011

(65) Prior Publication Data

US 2012/0287724 A1 Nov. 15, 2012

(51) Int. Cl.
*G11C 11/40* (2006.01)
*G11C 16/34* (2006.01)
*G11C 16/32* (2006.01)
*G11C 16/04* (2006.01)

(52) U.S. Cl.
CPC ........ *G11C 16/0483* (2013.01); *G11C 16/3454* (2013.01); *G11C 16/32* (2013.01); *G11C 16/0433* (2013.01)
USPC ............ 365/185.26; 365/185.05; 365/185.14; 365/185.18; 365/185.24

(58) Field of Classification Search
USPC ................................................... 365/185.26
See application file for complete search history.

(56) References Cited

U.S. PATENT DOCUMENTS

| 6,266,278 B1* | 7/2001 | Harari et al. ............. 365/185.18 |
| 2003/0161184 A1* | 8/2003 | Lee et al. ................... 365/185.3 |
| 2005/0157551 A1* | 7/2005 | Harari et al. ............. 365/185.03 |

* cited by examiner

*Primary Examiner* — Hoai V Ho
*Assistant Examiner* — Jay Radke
(74) *Attorney, Agent, or Firm* — J.C. Patents

(57) ABSTRACT

A method of programming a memory is provided. The memory has a first cell, having a first S/D region and a second S/D region shared with a second cell. The second cell has a third S/D region opposite to the second S/D region. When programming the first cell, a first voltage is applied to a control gate of the first cell, a second voltage is applied to a control gate of the second cell to slightly turn on a channel of the second cell, a third and a fourth voltage are respectively applied to the first and the third S/D regions, and the second S/D region is floating. A carrier flows from the third S/D region to the first S/D region, and is injected into a charge storage layer of the first cell by source-side injection.

15 Claims, 7 Drawing Sheets

METHOD OF PROGRAMMING MEMORY AND MEMORY APPARATUS UTILIZING THE METHOD

BACKGROUND OF THE INVENTION

1. Field of the Invention

The present invention relates to an operation of a memory device, and more particularly, to a method for programming a cell in a memory (array) and a memory apparatus utilizing the same.

2. Description of Related Art

A non-volatile memory is characterized by allowing multiple and repetitive writing, reading and erasing operations as well as retaining storage data even after power supply is cut off. The non-volatile memory has become a mandatory component in many electronic products for ensuring normal operation during booting the electronic products, and therefore has been broadly adopted in personal computers (PCs) and other electronic equipments.

In general, a conventional non-volatile memory device is designed to have a stacked gate structure including a floating gate and a control gate both made of doped polysilicon. The floating gate is disposed between the control gate and a substrate, and in a floating state that is not electrically connected with any circuit. The control gate is electrically connected with a word line. In addition, a tunneling oxide layer is disposed between the substrate and the floating gate, while an inter-gate dielectric layer is disposed between the floating gate and the control gate.

Another conventional non-volatile memory is a nitride read only memory which stores data through charge trapping. A charge-trapping structure composed of oxide layer-nitride layer-oxide layer, i.e. a well-known ONO layer, is capable of storing 2-bit data. In general, 2-bit data can be stored respectively at a left side (i.e. a left bit) and at a right side (i.e. a right bit) of the nitride layer in the charge-trapping structure.

Along with the current trend in continuous promotion of device integrity, dimensions of the device are reduced in accordance with the design rule. As the dimensions of the memory device and the memory cells thereof are miniaturized, it is unavoidable that punch-through current between the cells would be more significant. The punch-through current provided by an unselected cell makes a great impact on stability during the programming operation of a selected cell, thereby significantly degrading performance of the memory cells.

SUMMARY OF THE INVENTION

A method of programming a memory is provided. The memory has a first cell and a neighboring second cell in the memory share an S/D region which is floating during programming. The second cell functions as a switching transistor, and a channel of the second cell is slightly turned on, thereby programming the first cell by the source-side injection.

A method of programming a cell in a memory array is also provided, in which the source-side injection and the channel-hot-carrier injection are combined sequentially to program the cell in the memory array.

A memory apparatus, including a memory array and a circuit unit is also provided, wherein the programming method according to one embodiment of the present invention can be applied to the memory array, and the circuit unit can perform steps of the programming method according to one embodiment of the present invention.

A method of programming a memory is provided. The memory has a first cell having a first S/D region and sharing a second S/D region with a second cell, and the second cell has a third S/D region opposite to the second S/D region. When the first cell is programmed, a first voltage is applied to a first control gate of the first cell; a second voltage is applied to a second control gate of the second cell to slightly turn on a channel of the second cell; a third voltage and a fourth voltage are respectively applied to the first S/D region and the third S/D region; and the second S/D region is floating. Owing to the third and the fourth voltages, carriers flow from the third S/D region toward the first S/D region, so that the carriers are injected into a charge storage layer of the first cell by the source-side injection.

According to a first embodiment of the present invention, the second voltage is approximately a threshold voltage of the second cell.

According to the first embodiment of the present invention, the first and the second cells are both N-type cells, and the third voltage is higher than the fourth voltage in positive value.

According to the first embodiment of the present invention, the charge storage layer is one of a floating gate, a charge-trapping layer, and a nano-crystal layer.

According to the first embodiment of the present invention, the charge storage layer may be a charge-trapping layer, and the carriers are trapped at a site in the charge storage layer of the first cell close to the second S/D region.

A method of programming a memory is provided. The memory has a first cell having a first S/D region and sharing a second S/D region with a second cell, and the second cell has a third S/D region opposite to the second S/D region. When the first cell is programmed, a first voltage is applied to a first control gate of the first cell; a second voltage is applied to a second control gate of the second cell to switch a channel of the second cell from a slightly-turned-on state to a fully-turned-on state; a third voltage and a fourth voltage are respectively applied to the first S/D region and the third S/D region; and the second S/D region is floating. Owing to the third and the fourth voltages, carriers flow from the third S/D region toward the first S/D region, so that the carriers are injected into a charge storage layer of the first cell by the source-side injection and the channel-hot-carrier injection.

According to a second embodiment of the present invention, the method of applying the second voltage to the second control gate of the second cell includes applying a plurality of voltage pulses with different intensity to the second control gate.

According to a third embodiment of the present invention, the method of applying the second voltage to the second control gate of the second cell includes applying a triangular voltage pulse to the second control gate.

According to a fourth embodiment of the present invention, the method of applying the second voltage to the second control gate of the second cell includes applying a trapezoid voltage pulse to the second control gate.

According to the fourth embodiment of the present invention, a value of the trapezoid voltage pulse increases progressively to a maximum maintained for a period of time and then decreases progressively, or the value of the trapezoid voltage pulse decreases progressively to a minimum maintained for a period of time and then increases progressively.

According to the second embodiment of the present invention, the first and the second cells are both N-type cells, and the third voltage is higher than the fourth voltage in positive value.

According to the second embodiment of the present invention, the charge storage layer is one of a floating gate, a charge-trapping layer, and a nano-crystal layer.

According to the second embodiment of the present invention, the charge storage layer may be a charge-trapping layer, and the carriers are trapped at sites in the charge storage layer of the first cell respectively close to the first S/D region and close to the second S/D region.

A method of programming a cell in a memory array is provided. When performing a programming operation, a first voltage is applied to a first control gate of a first cell through a first word line; a second voltage is applied to a second control gate of a second cell adjacent to the first cell so as to slightly or fully turn on a channel of the second cell, wherein the first cell has a first S/D region and shares a second S/D region with the second cell, and the second cell has a third S/D region opposite to the second S/D region; a third voltage is applied to the first S/D region through a first bit line; the second S/D region is floating; and a fourth voltage is applied to the third S/D region through a second bit line. Owing to the third and the fourth voltages, carriers flow from the third S/D region toward the first S/D region, so that the carriers are injected into a charge storage layer of the first cell by the source-side injection or the channel-hot-carrier injection.

According to a fifth embodiment of the present invention, the first and the second cells are both N-type cells, and the third voltage is higher than the fourth voltage in positive value.

According to the fifth embodiment of the present invention, the charge storage layer is one of a floating gate, a charge-trapping layer, and a nano-crystal layer.

According to the fifth embodiment of the present invention, the charge storage layer may be a charge-trapping layer, and the channel of the second cell is slightly turned on owing to the second voltage, such that the carriers are trapped at a site in the charge storage layer of the first cell close to the second S/D region.

According to the fifth embodiment of the present invention, the charge storage layer may be a charge-trapping layer, and the channel of the second cell is fully turned on owing to the second voltage, such that the carriers are trapped at a site in the charge storage layer of the first cell close to the first S/D region.

According to the fifth embodiment of the present invention, the charge storage layer may be a charge-trapping layer, and the channel of the second cell is switched from a slightly-turned-on state to a fully-turned-on state, such that the carriers are trapped at sites in the charge storage layer of the first cell respectively close to the first S/D region and close to the second S/D region.

According to the fifth embodiment of the present invention, the memory array includes a plurality of cells arranged in a column/row array, a plurality of word lines, and a plurality of bit lines. Each of the cells includes a control gate. In a same row, the cells are serially connected together respectively by an S/D region to form a memory cell row, and every two neighboring cells may serve as a memory cell set. The S/D region between the two neighboring cells in the memory cell set is floated. The word lines are arranged in parallel along a column direction, and each of the word lines is coupled to the control gates of a column of the cells. The bit lines are arranged in parallel along a row direction. In the same row, the S/D regions serially connecting the memory cell sets are alternately coupled to two bit lines, and two neighboring memory cell rows share one bit line.

According to the fifth embodiment of the present invention, the method of programming the cell in the memory array further includes applying a fifth voltage to a third bit line adjacent to the first bit line, so as to inhibit an unselected cell sharing the first word line and the first bit line with the first cell from being programmed. The fifth voltage may be equal to 0.5 to 1 times of the third voltage.

According to the fifth embodiment of the present invention, the method of programming the cell in the memory array further includes applying a sixth voltage to a fourth bit line adjacent to the second bit line, so as to inhibit an unselected cell sharing the first word line and the second bit line with the first cell from being programmed. The sixth voltage may be equal to the fourth voltage.

A memory apparatus is provided, the memory apparatus includes a memory array and a circuit unit. The circuit unit is connected to the memory array. When a cell in the memory array is programmed, the circuit unit at least performs following steps. A first voltage is applied to a first control gate of a first cell through a first word line. A second voltage is applied to a second control gate of a second cell adjacent to the first cell through a second word line, so as to slightly or fully turn on a channel of the second cell, wherein the first cell has a first S/D region and shares a second S/D region with the second cell, and the second cell has a third S/D region opposite to the second S/D region. A third voltage is applied to the first S/D region through a first bit line. The second S/D region is floating. A fourth voltage is applied to the third S/D region through a second bit line. Carriers flow from the third S/D region toward the first S/D region owing to the third voltage and the fourth voltage, so that the carriers are injected into a charge storage layer of the first cell by the source-side injection or the channel-hot-carrier effect.

According to a sixth embodiment of the present invention, the charge storage layer is one of a floating gate, a charge-trapping layer, and a nano-crystal layer.

According to the sixth embodiment of the present invention, the charge storage layer may be a charge-trapping layer, and the channel of the second cell is slightly turned on owing to the second voltage, such that the carriers are trapped at a site in the charge storage layer of the first cell close to the second S/D region.

According to the sixth embodiment of the present invention, the charge storage layer may be a charge-trapping layer, and the channel of the second cell is fully turned on owing to the second voltage, such that the carriers are trapped at a site in the charge storage layer of the first cell close to the first S/D region.

According to the sixth embodiment of the present invention, the charge storage layer may be a charge-trapping layer, and the channel of the second cell is switched from a slightly-turned-on state to a fully-turned-on state, such that the carriers are trapped at sites in the charge storage layer of the first cell respectively close to the first S/D region and close to the second S/D region.

According to the sixth embodiment of the present invention, the circuit unit further performs following steps during the programming. A fifth voltage is applied to a third bit line adjacent to the first bit line, so as to inhibit an unselected cell sharing the first word line and the first bit line with the first cell from being programmed; and a sixth voltage is applied to a fourth bit line adjacent to the second bit line, so as to inhibit an unselected cell sharing the first word line and the second bit line with the first cell from being programmed.

According to the sixth embodiment of the present invention, the fifth voltage may be equal to 0.5 to 1 times of the third voltage.

According to the sixth embodiment of the present invention, the memory array includes a plurality of cells arranged in a column/row array, a plurality of word lines, and a plurality of bit lines. Each of the cells includes a control gate. In a same row, the cells are serially connected together respectively by an S/D region to form a memory cell row, and every two neighboring cells may serve as a memory cell set. The S/D region between the two neighboring cells in the memory cell set is floating. The word lines are arranged in parallel along a column direction, and each of the word lines is coupled to the control gates of a column of the cells. The bit lines are arranged in parallel along a row direction. In the same row, the S/D regions serially connecting the memory cell sets are alternately coupled to two bit lines, and two neighboring memory cell rows share one bit line.

In the programming method according to the sixth embodiment of the present invention, the cell is programmed by the source-side injection. Accordingly, the bias applied thereto is relatively low, so that programming speed can be enhanced.

In the programming method according to the sixth embodiment of the present invention, the cell is programmed by the sequential combination of the source-side injection and the channel-hot-carrier injection. When the memory cell set consisting of two cells utilizes this method, 4-bit data stored in a single memory cell set can be achieved.

In the programming method according to the sixth embodiment of the present invention, the programming speed of the cell is accelerated, and the device integration is increased, so that memory programming window can be widened.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
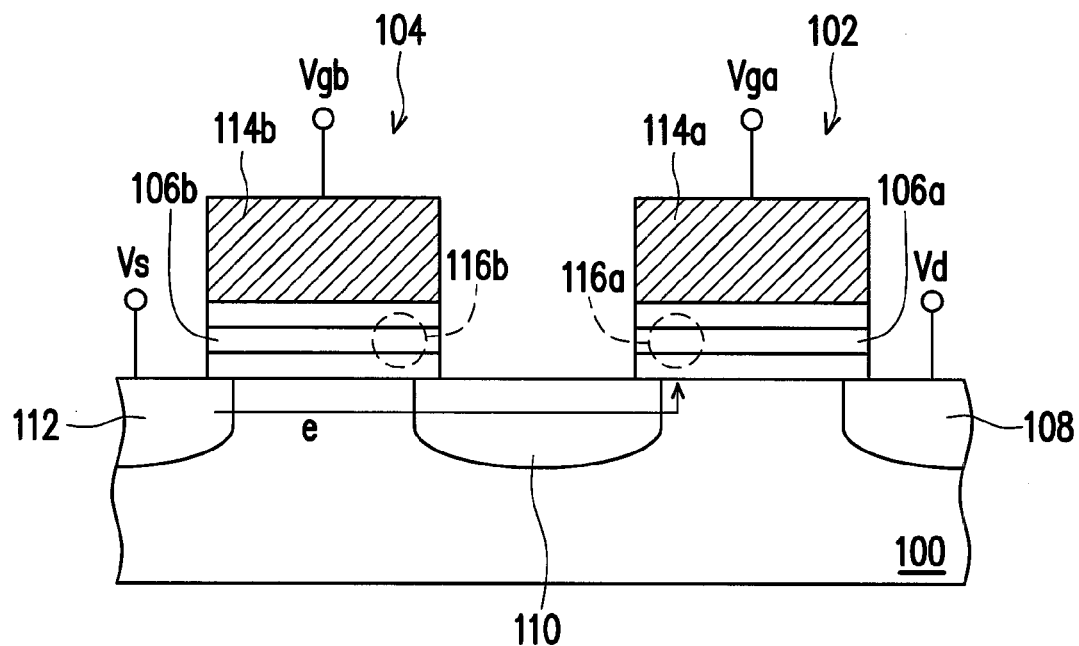
FIG. 1 depicts a method for programming a cell in a non-volatile memory according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

A method of programming a cell in a non-volatile memory is provided, suitable for a memory cell set consisting of two cells connected in series. In the memory cell set, one of the cells may serve as a cell to be programmed, and the other may serve as a switching transistor. By tuning a channel of the cell as the switching transistor in a slightly-turned-on state or in a fully-turned-on state, carriers can be injected into a charge storage layer of the cell to be programmed by the source-side injection or the channel-hot-carrier effect, respectively.

FIG. 1 depicts a method for programming a cell in a non-volatile memory according to a first embodiment of the present invention. For illustration purposes, the following disclosure is described in terms of N-type memory cells, which is illustrated only as an exemplary example, but should not be adopted for limiting the scope of the present invention.

Referring to FIG. 1, in the non-volatile memory, the memory cell set includes a cell 102 and a cell 104 connected in series. The cell 102 includes a charge storage layer 106a and an N-type source/drain region (i.e. S/D region) 108, and shares an N-type S/D region 110 with the neighboring cell 104. The cell 104 includes a charge storage layer 106b and an N-type S/D region 112 opposite to the S/D region 110. Each of the charge storage layers 106a and 106b independently can be a floating gate, a charge-trapping layer or a nano-crystal layer. When the charge storage layers 106a and 106b are the floating gates, the charge storage layers 106a and 106b may be separated from control gates 114a and 114b by ONO composite layers, respectively. When the charge storage layers 106a and 106b are the charge-trapping layers, material thereof can be chosen among silicon nitride (SiN), aluminum oxide or other high dielectric constant materials. When the charge storage layers 106a and 106b are the nano-crystal layers, material thereof can be silicon-, germanium- or metal-containing nano-crystal.

It is noted that the first embodiment, in which the cell 102 is to be programmed while the cell 104 functions as the switching transistor, is provided for illustration purposes, and should not be construed as limiting the scope of the present invention. In an exemplary programming operation, a gate voltage Vga is applied to the control gate 114a. The gate voltage Vga has to be high enough so as to inject hot electrons into the charge storage layer 106a. In addition, by tuning the value of the gate voltage Vga, programming level of the cell 102 can be well controlled, and the cell can thus store multi-bit data. A gate voltage Vgb is applied to the control gate 114b, so as to slightly turn on a channel under the charge storage layer 106b. In the first embodiment, the so-called channel in a slightly-turned-on state may indicates that the channel is not fully turned on, and therefore only a minor portion of the electrons can flow through the channel. The gate voltage Vgb may be approximately a threshold voltage of the cell 104, possibly being equal to the threshold voltage value of the cell 104 ±5%. A voltage Vs and a voltage Vd which is higher than Vs in positive value are respectively applied to the S/D regions 112 and 108, while the S/D region 110 is floating. The voltage Vd has to be high enough to heat the hot electrons, so that the hot electrons are capable of overcoming a barrier height between silicon and silicon oxide (Si/SiO$_2$ barrier height). The voltages Vs and Vd drive the electrons to flow from the S/D region 112 toward the S/D region 108.

Since the channel of the cell 104 is slightly turned on, only a minor portion of the electrons can flow through the channel of the cell 104, which indicates generation of lower programming current. Moreover, the potential of the floating S/D region 110 may be raised, and a dominant heating field is induced nearby the drain side of the cell 104 (i.e. S/D region 110). Accordingly, the electrons can be injected into the charge storage layer 106a of the cell 102 at the source side of the cell 102 (i.e. S/D region 110) by means of the source-side injection. In the first embodiment, the gate voltage Vga=10V, the gate voltage Vgb=Vth±5%, the voltage Vs=ground or 0V, and the voltage Vd=3 to 5V.

On the other hand, when the cell 104 is set to be programmed, the cell 102 functions as the switching transistor. The gate voltage Vga is applied to the control gate 114b, while the gate voltage Vgb is applied to the control gate 114a. The voltage Vs and the voltage Vd which is higher than Vs in positive value are respectively applied to the S/D regions 108 and 112, while the S/D region 110 is floating. The electrons can thus be injected into the charge storage layer 106b of the cell 104 at the source side of the cell 104 (i.e. S/D region 110) by means of the source-side injection.

In the first embodiment, when the charge storage layers 106a and 106b are the charge-trapping layers, the electrons are trapped at a site 116a in the charge storage layer layer 106a close to the S/D region 110, and at a site 116b in the charge storage layer 106b close to the S/D region 110.

According to the first embodiment of the present invention, the cell 102 or 104 is programmed by the source-side injection, and therefore the bias applied thereto can be relatively low, thereby enhancing the programming speed.

Figure 2:
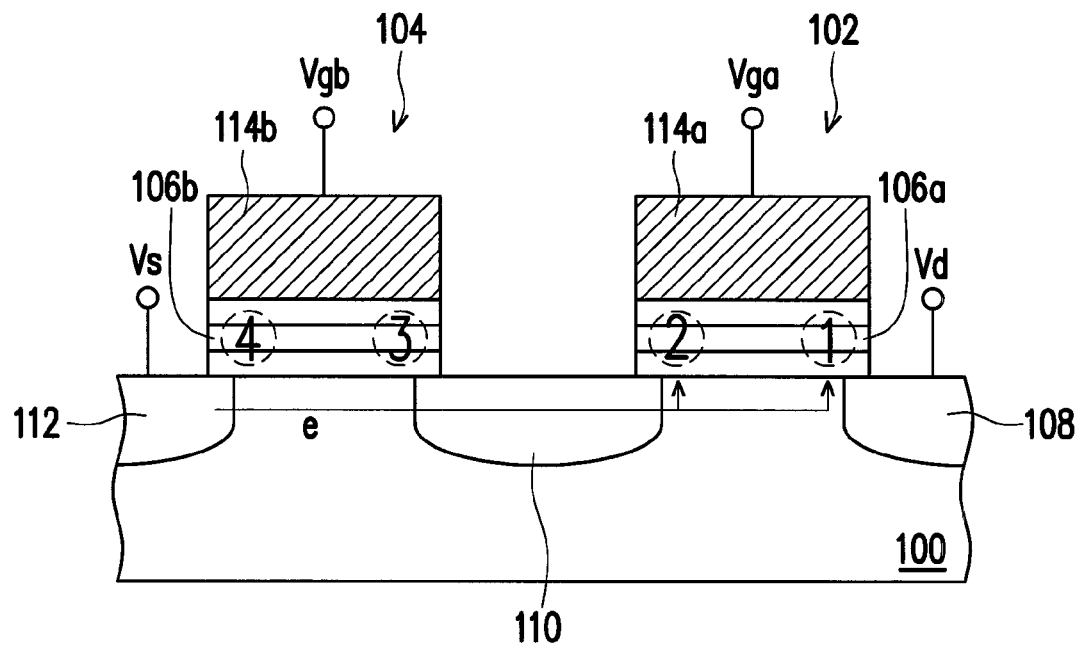
FIG. 2 depicts a method for programming a cell in a non-volatile memory according to a second embodiment of the present invention.

FIG. 2 depicts a method for programming a cell in a nonvolatile memory according to a second embodiment of the present invention.

Referring to FIG. 2, it is noted that the second embodiment, in which the cell 102 is to be programmed while the cell 104 functions as the switching transistor, is provided for illustration purposes, and should not be construed as limiting the scope of the present invention. In an exemplary programming operation, the gate voltage Vga is applied to the control gate 114a. The gate voltage Vga has to be high enough so as to inject the hot electrons into the charge storage layers 106a. In addition, by tuning the value of the gate voltage Vga, programming level of the cell 102 can be well controlled, and the cell can thus store multi-bit data. The gate voltage Vgb is applied to the control gate 114b, so as to slightly or fully turn on the channel under the charge storage layer 106b or, in the alternative, to switch the channel under the charge storage layer 106b from a slightly-turned-on state to a fully-turned-on state. In the second embodiment, the so-called channel in the slightly-turned-on state may indicate that the channel is not fully turned on, and therefore only a minor portion of the electrons can flow through the channel. When the channel is slightly turned on, the gate voltage Vgb may be approximately the threshold voltage of the cell 104, possibly being equal to the threshold voltage value of the cell 104 ±5%. Moreover, the so-called channel in the fully-turned-on state may indicate that a major portion of the electrons can flow through the channel, and meanwhile, the gate voltage Vgb may be much higher than the threshold voltage of the cell 104. The voltage Vs and the voltage Vd which is higher than Vs in positive value are respectively applied to the S/D regions 112 and 108, while the S/D region 110 is floating. The voltages Vs and Vd drive the electrons to flow from the S/D region 112 to the S/D region 108. The voltage Vd has to be sufficiently high, such that the heated hot electrons are capable of overcoming the barrier height between silicon and silicon oxide (Si/SiO$_2$ barrier height).

When the channel of the cell 104 is in the slightly-turned-on state, only a minor portion of the electrons can flow through the channel of the cell 104, indicating the generation of lower programming current. In addition, since the potential of the floating S/D region 110 is raised, a dominant heating field is induced nearby the drain side of the cell 104 (i.e. S/D region 110). Accordingly, the electrons can be injected into the charge storage layer 106a of the cell 102 at the source side of the cell 102 (i.e. S/D region 110) by means of the source-side injection.

When the channel of the cell 104 is in the fully-turned-on state, the major portion of the electrons can flow through the channel of the cell 104, indicating the generation of higher programming current. In addition, since the potential of the floating S/D region 110 is diminished, a dominant heating field is induced nearby the drain side of the cell 102 (i.e. S/D region 108). Accordingly, the electrons can be injected into the charge storage layer 106a of the cell 102 at the drain side of the cell 102 (i.e. S/D region 108) by means of the channel-hot-electron injection.

When the channel of the cell 104 is switched from a slightly-turned-on state to a fully-turned-on state, the electrons can be injected into the charge storage layer 106a of the cell 102 at the source side of the cell 102 (i.e. S/D region 110) and at the drain side of the cell 102 (i.e. S/D region 108) by means of the channel-hot-electron injection and the source-side injection, respectively.

On the other hand, when the cell 104 is being programmed, the cell 102 may function as the switching transistor. The gate voltage Vga is applied to the control gate 114b. The gate voltage Vgb is applied to the control gate 114a, so as to either slightly or fully turn on the channel under the charge storage layer 106a or, in the alternative, to switch the channel under the charge storage layer 106a from a slightly-turned-on state to a fully-turned-on state. The voltage Vs and the voltage Vd which is higher than Vs in positive value are respectively applied to the S/D regions 108 and 112, while the S/D region 110 is floating. The electrons can be injected into either the charge storage layer 106b of the cell 104 at the source side of the cell 104 (i.e. S/D region 110) or at the drain side of the cell 104 (i.e. S/D region 112) or, in the alternative, at both of the source side (i.e. S/D region 110) and the drain side (i.e. S/D region 112) by means of either the source-side injection or the channel-hot-electron injection or, in the alternative, the sequential combination of the source-side injection and the channel-hot-electron injection, respectively.

In the second embodiment, when the charge storage layers 106a and 106b are charge-trapping layers, electrons are trapped at a site 2 in the charge storage layer 106a close to the S/D region 110 and trapped at a site 3 in the charge storage layer 106b close to the S/D region 110, when the programming operation is implemented by the source-side injection. Electrons are trapped at a site 1 of the charge storage layer 106a close to the S/D region 108 and trapped at a site 4 in the charge storage layer 106b close to the S/D region 112, when the programming operation is implemented by the channel-hot-electron injection.

When the channel under the charge storage layer 106b is switched from a slightly-turned-on state to a fully-turned-on state, the electrons can be trapped at the site 2 in the charge storage layer 106a close to the S/D region 110 and trapped at the site 1 in the charge storage layer 106a close to the S/D region 108 through the source-side injection and the channel-hot-electron injection in a single step of programming, respectively. When the channel under the charge storage layer 106a is switched from a slightly-turned-on state to a fully-turned-on state, the electrons can be trapped at the site 3 in the charge storage layer 106b close to the S/D region 110 and trapped at the site 4 in the charge storage layer 106b close to the S/D region 112 through the source-side injection and the channel-hot-electron injection, respectively, in a single step of programming. Hence, 4-bit data stored in a single memory cell set can be achieved.

According to the second embodiment of the present invention, the method for programming the cell in the non-volatile memory is carried out by setting programming bias shown in Table 1, when the electrons are injected into the sites 1, 2, 3 and 4.

TABLE 1

|        | control gate 114a | control gate 114b | S/D region 108 | S/D region 112 |
|--------|-------------------|-------------------|----------------|----------------|
| site 1 | Vga               | high Vgb          | Vd             | Vs (ground)    |
| site 2 | Vga               | low Vgb           | Vd             | Vs (ground)    |
| site 3 | low Vgb           | Vga               | Vs (ground)    | Vd             |
| site 4 | high Vgb          | Vga               | Vs (ground)    | Vd             |

According to the second embodiment of the present invention, the method for programming the cell in the non-volatile memory is carried out by setting bias shown in Table 2, when reading the sites 1, 2, 3 and 4 of the cells.

TABLE 2

|        | control gate 114a | control gate 114b | S/D region 108 | S/D region 112 |
|--------|-------------------|-------------------|----------------|----------------|
| site 1 | Vr                | >>Vth             | ground         | Vdr            |
| site 2 | Vr                | >>Vth             | Vdr            | ground         |
| site 3 | >>Vth             | Vr                | ground         | Vdr            |
| site 4 | >>Vth             | Vr                | Vdr            | ground         |

According to the second embodiment of the present invention, the cell having the charge-trapping layer is programmed by means of the combination of the source-side injection and the channel-hot-electron injection. When this method is applied to the memory cell set consisting of two cells, 4-bit data stored in the single memory cell set can be achieved. Moreover, the method according to the second embodiment of the present invention can accelerate the programming speed of the cell, and provide a larger memory window.

Figure 3:
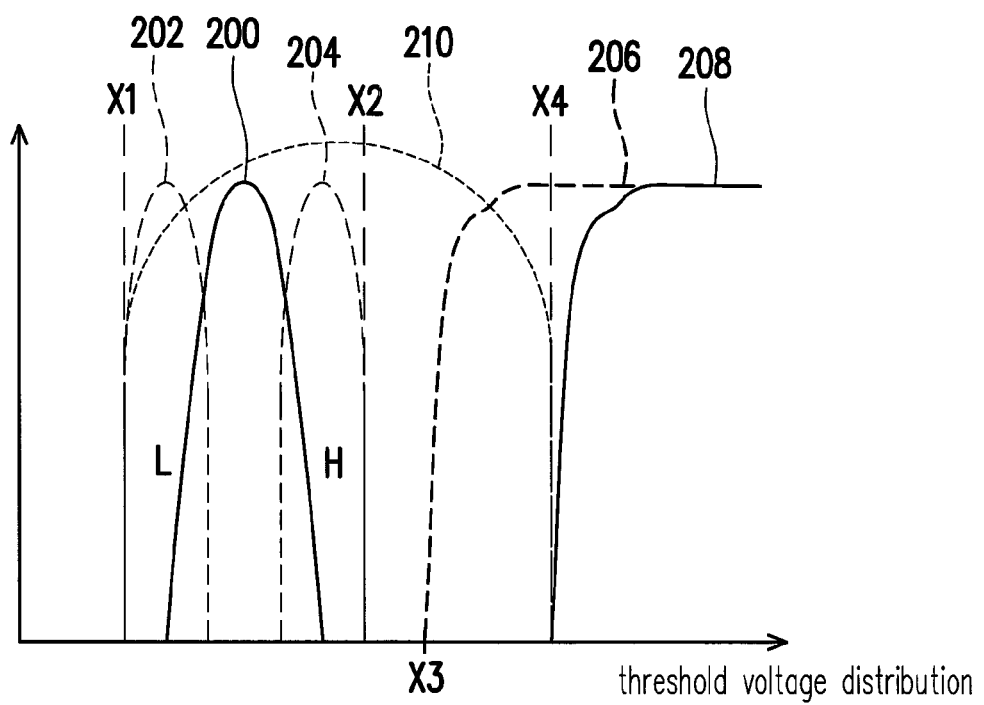
FIG. 3 schematically illustrates a threshold voltage distribution of a cell functioning as a switching transistor according to the first and the second embodiments of the present invention.

FIG. 3 schematically illustrates a threshold voltage distribution of a cell functioning as a switching transistor according to the first and the second embodiments of the present invention. The way to obtain a voltage value range of the gate voltage Vgb is illustrated with FIG. 3.

In FIG. 3, distribution curve 200 represents an original threshold voltage of the cell functioning as the switching transistor. When the programming operation is implemented by the source-side injection, a low-bound threshold voltage distribution curve 202 and a high-bound threshold voltage distribution curve 204 can be obtained. A voltage value X1 of the corresponding maximum gate voltage Vgb is obtained based on the low-bound threshold voltage distribution curve 202, while a voltage value X2 of the corresponding maximum gate voltage Vgb is obtained based on the high-bound threshold voltage distribution curve 204. When the programming operation is implemented by the channel-hot-electron injection, a low-bound threshold voltage distribution curve 206 and a high-bound threshold voltage distribution curve 208 can be obtained. A voltage value X3 of the corresponding minimum gate voltage Vgb is obtained based on the low-bound threshold voltage distribution curve 206, while a voltage value X4 of the corresponding minimum gate voltage Vgb is obtained based on the high-bound threshold voltage distribution curve 208.

In order to enable the cell functioning as the switching transistor to be in the slightly-turned-on state, the voltage value range of the gate voltage Vgb is preferably set between the voltage value X1 and the voltage value X2, that is, the low Vgb shown in Table 1. Certainly, the minimum value of the gate voltage Vgb can be slightly less than the voltage value X1, and the maximum value of the gate voltage Vgb can be slightly greater than the voltage value X2 but less than the voltage value X3. By making the voltage range of the gate voltage Vgb cover the voltage values X1 and X2 without exceeding the voltage value X3, the cell is restricted to be programmed merely through the source-side injection.

In order to enable the cell functioning as the switching transistor to be in the fully-turned-on state, the voltage value range of the gate voltage Vgb is preferably set greater than the voltage value X3, that is, the high Vgb shown in Table 1.

In order to enable the cell functioning as the switching transistor to be switched from a slightly-turned-on state to a fully-turned-on state, an operating region 210 is preferably set between the voltage value X1 and the voltage value X4. In other words, the voltage value range of the gate voltage Vgb may be set from X1 to X4. Certainly, the minimum value of the gate voltage Vgb can be slightly less than the voltage value X1, and the maximum value of the gate voltage Vgb can be slightly greater than the voltage value X4. By making the voltage range of the gate voltage Vgb cover the voltage values X1 and X4, the source-side injection and the channel-hot-electron injection may be sequentially combined for programming the cell.

A method for applying the gate voltage Vgb to the control gates 114a and 114b to switch the channels under the charge storage layers 106a and 106b from a slightly-turned-on state to a fully-turned-on state is then illustrated in the following.

Figure 4A:
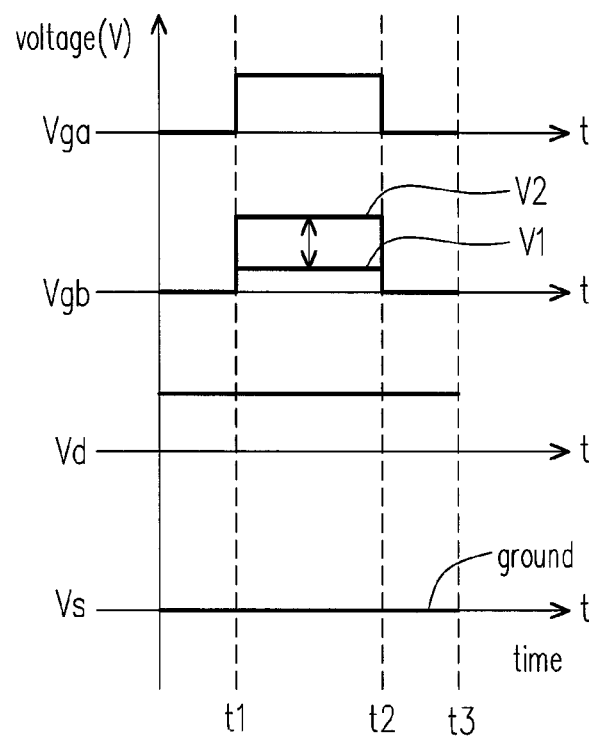
FIG. 4A schematically illustrates a timing diagram of an applied voltage pulse during a programming operation of a cell according to the second embodiment of the present invention.
Figure 4B:
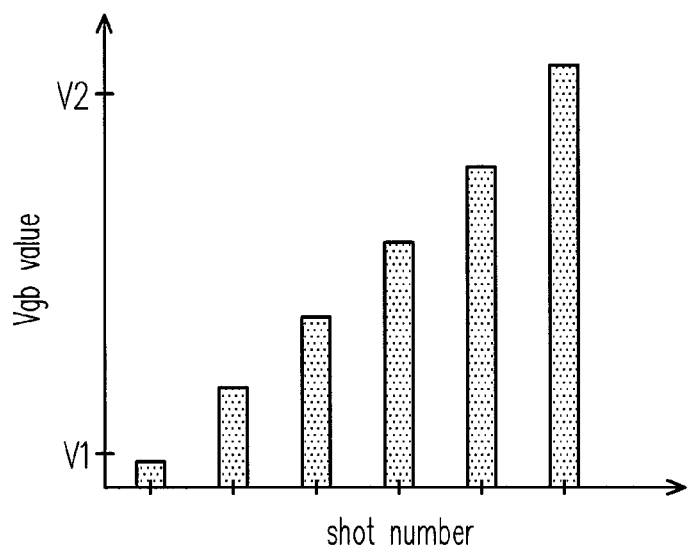
FIG. 4B schematically illustrates a relationship diagram between voltage and shot number of an applied voltage pulse during a programming operation of a cell according to the second embodiment of the present invention.

FIG. 4A schematically illustrates a timing diagram of an applied voltage pulse during a programming operation of a cell according to the second embodiment of the present invention. FIG. 4B schematically illustrates a relationship diagram between voltage and shot number of an applied voltage pulse during a programming operation of a cell according to the second embodiment of the present invention. For illustration purposes, the disclosure herein is described in terms of the electrons being trapped at the site 2 in the charge storage layer 106a close to the S/D region 110 and at the site 1 in the charge storage layer 106a close to the S/D region 108, which is only as an exemplary example.

Referring to FIG. 2, FIG. 4A and FIG. 4B, the gate voltage Vga is applied to the control gate 114a. The voltage Vs and the voltage Vd which is higher than Vs in positive value are respectively applied to the S/D regions 112 and 108, while the S/D region 110 is floating. The gate voltage Vgb is applied to the control gate 114b, such that the channel under the charge storage layer 106b can be switched from a slightly-turned-on state to a fully-turned-on state. The method for applying the gate voltage Vgb to the control gate 114b may include applying a plurality of voltage pulses with different intensity to the control gate 114b.

As shown in FIG. 4A and FIG. 4B, the gate voltage Vgb in the form of a square voltage pulse is applied to the control gate 114b. When performing the programming operation, the intensity of each voltage pulse may be increased by a constant, wherein the constant is 0.5V, for example.

In the case of the programming operation performed only through the source-side injection, when a value of the gate voltage Vgb for the first shot is V1, the voltage value V1 is, for example, slightly less than the voltage value X1. When a value of the gate voltage Vgb for the last shot is V2, the voltage value V2 is, for example, greater than the voltage value X2 but less than the voltage value X3.

In the case of the programming operation performed through the sequential combination of the source-side injection and the channel-hot-electron injection, when the value of the gate voltage Vgb for the first shot is V1, the voltage value V1 is, for example, less than the voltage value X1. When the value of gate voltage Vgb for the last shot is V2, the voltage value V2 is, for example, greater than the voltage value X4.

Certainly, the voltage pulses with different intensity can be applied based on any combination of variations in intensity.

Figure 5A:
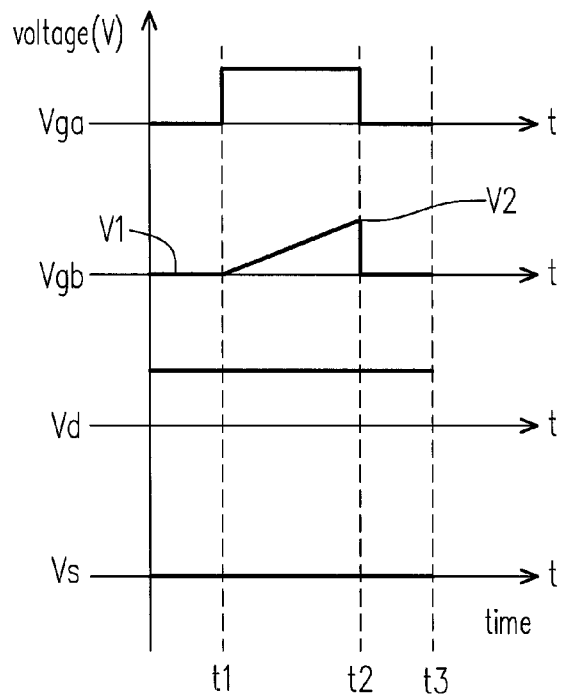
FIGS. 5A and 5B respectively illustrate a timing diagram of an applied voltage pulse during a programming operation of a cell according to a third embodiment of the present invention.
Figure 5B:
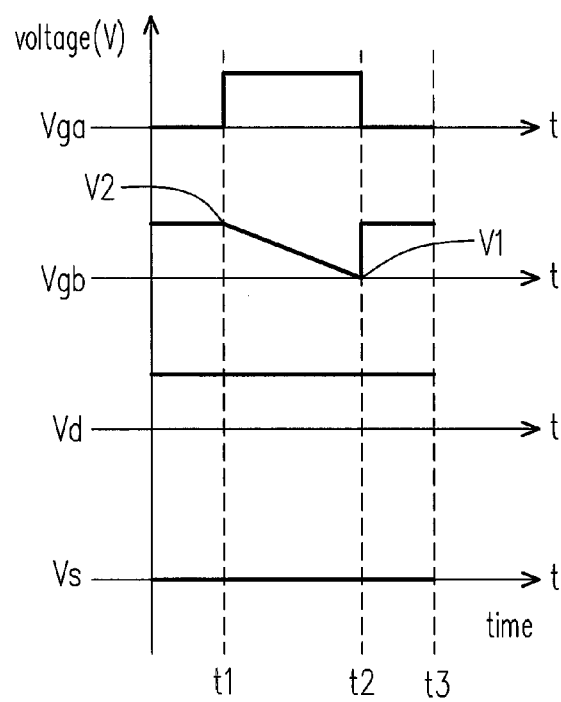

FIGS. 5A and 5B respectively illustrate a timing diagram of an applied voltage pulse during a programming operation of a cell according to a third embodiment of the present invention.

Referring to FIGS. 5A and 5B, the gate voltage Vgb in the form of a triangular voltage pulse is applied to the control gate 114b. For instance, when performing the programming operation, the value of the triangular voltage pulse increases progressively from the voltage value V1 to the voltage value V2, or decreases progressively from the voltage value V2 to the voltage value V1. It is noted that the slope of the triangular voltage pulse is expected to be as small as possible.

When the programming operation is implemented only by the source-side injection, the voltage value V1 may be less than the voltage value X1, and the voltage value V2 may be greater than the voltage value X2 but less than the voltage value X3.

When the programming operation is implemented by the sequential combination of the source-side injection and the channel-hot-electron injection, the voltage value V1 may be less than the voltage value X1, and the voltage value V2 may be greater than the voltage value X4.

Figure 6A:
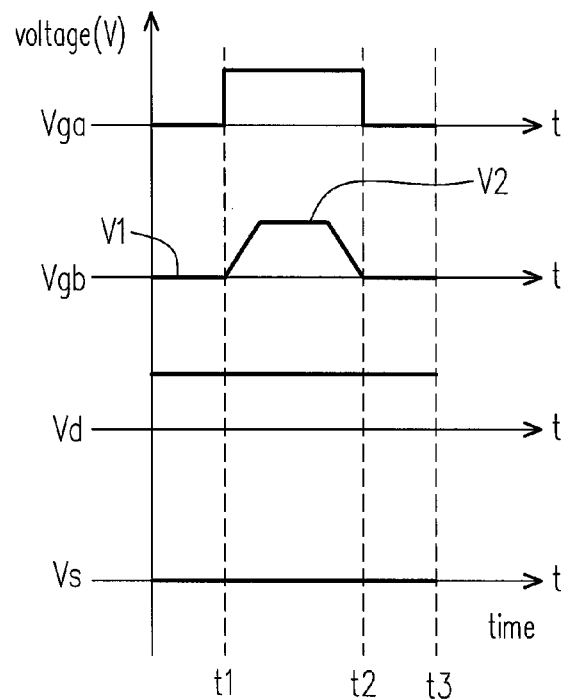
FIGS. 6A and 6B respectively illustrate a timing diagram of an applied voltage pulse during a programming operation of a cell according to a fourth embodiment of the present invention.
Figure 6B:
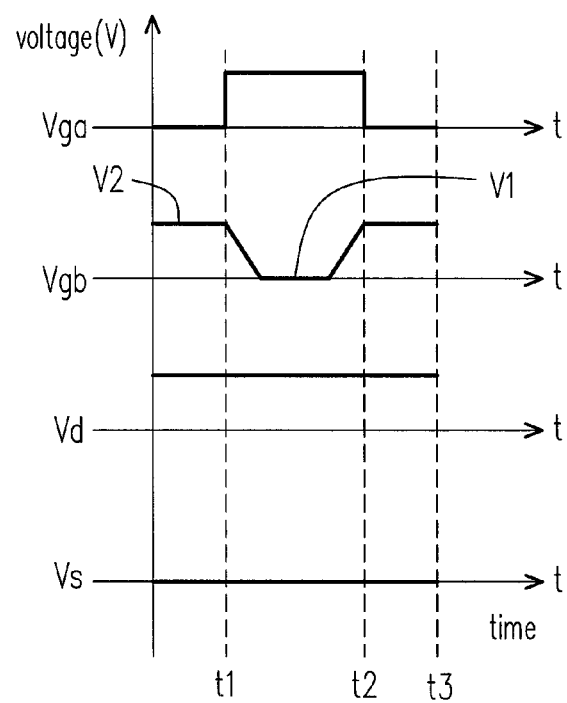

FIGS. 6A and 6B respectively illustrate a timing diagram of an applied voltage pulse during a programming operation of a cell according to a fourth embodiment of the present invention.

Referring to FIGS. 6A and 6B, the gate voltage Vgb in the form of a trapezoid voltage pulse is applied to the control gate 114b. When performing the programming operation, the value of the trapezoid voltage pulse increases progressively from the voltage value V1 to the voltage value V2, which is maintained for a period of time, and then decreases progressively to the voltage value V1, or the value of the trapezoid voltage pulse decreases progressively from the voltage value V2 to the voltage value V1, which is maintained for a period of time, and then increases progressively to the voltage value V2.

When the programming operation is implemented only by the source-side injection, the voltage value V1 may be less than the voltage value X1, and the voltage value V2 may be greater than the voltage value X2 but less than the voltage value X3.

When the programming operation is implemented by the sequential combination of the source-side injection and the channel-hot-electron injection, the voltage value V1 may be less than the voltage value X1, and the voltage value V2 may be greater than the voltage value X4.

The foregoing disclosure is provided in terms of the square voltage pulse, the triangular voltage pulse and the trapezoid voltage pulse, which is illustrated only as an exemplary example. Certainly, as long as the gate voltage Vgb is set to cover the operating region 210, voltage pulses in the form of other types can be adopted.

Figure 7:
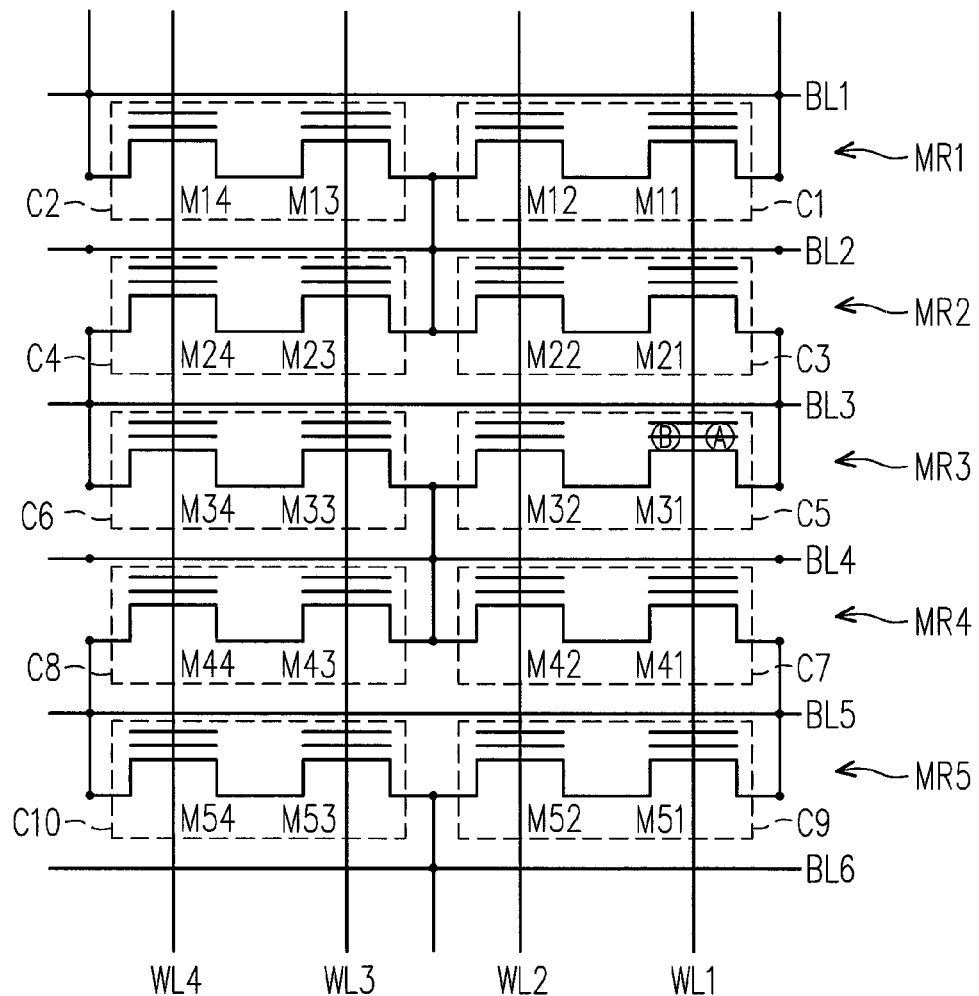
FIG. 7 depicts, in circuitry, a non-volatile memory array according to a fifth embodiment of the present invention.

FIG. 7 depicts, in circuitry, a non-volatile memory array according to a fifth embodiment of the present invention. The programming method in the invention is suitable for this non-volatile memory array.

Referring to FIG. 7, a memory array includes a plurality of cells M11 to M54 arranged in a column/row array, a plurality of word lines WL1 to WL4, and a plurality of bit lines BL1 to BL6.

Each of the cells M11 to M54 has a control gate, respectively. In the same row, the cells M11 to M54 are serially connected together respectively by the S/D regions, so as to form memory cell rows MR1 to MR5. Every two neighboring cells may serve as memory cell sets C1 to C10. In the memory cell sets C1 to C10, the S/D region between the two neighboring cells is floating. For example, the cells M11 to M14 are serially connected together respectively by the S/D regions to form the memory cell row MR1, and the cells M21 to M24 are serially connected together respectively by the S/D regions to form the memory cell row MR2. Likewise, the cells M51 to M54 are serially connected together respectively by the S/D regions to form the memory cell row MR5. The memory cell set C1 is composed of the cells M11 and M12, and the memory cell set C2 is composed of the cells M13 and M14. Likewise, the memory cell set C10 is composed of the cells M53 and M54.

The word lines WL1 to WL4 are arranged in parallel along a column direction. Each of the word lines WL1 to WL4 is coupled to the control gates of a column of the cells. For example, the word line WL1 is coupled to the control gates of a column of the cells M11 to M51, and the word line WL2 is coupled to the control gates of a column of the cells M12 to M52. Likewise, the word line WL4 is coupled to the control gates of a column of the cells M14 to M54.

The bit lines BL1 to BL4 are arranged in parallel along a row direction. In the same row, the S/D regions which serially connect the memory cell sets C1 to C10 are alternately coupled to two bit lines. For example, the S/D regions serially connecting the memory cell sets C1 to C2 are alternately coupled to the bit lines BL1 and BL2, and the S/D regions serially connecting the memory cell sets C3 to C4 are alternately coupled to the bit lines BL2 and BL3. Likewise, the S/D regions serially connecting the memory cell sets C9 to C10 are alternately coupled to the bit lines BL5 and BL6.

Furthermore, two neighboring memory cell rows of the memory cell rows MR1 to MR5 may share one bit line. For example, the memory cell rows MR2 and MR1 share the bit line BL2, and the memory cell rows MR2 and MR3 share the bit line BL3. Likewise, the memory cell rows MR4 and MR3 share the bit line BL4, and the memory cell rows MR4 and MR5 share the bit line BL5.

When the cell M31 is programmed, the gate voltage Vga is applied to the word line WL1 which is coupled with the control gate thereof. The gate voltage Vgb is applied to the word line WL2 which is coupled with the control gate of the neighboring cell M32 belonging to the same memory cell set C5 with the cell M31, so that the channel of the cell M32 can be switched from a slightly-turned-on state to a fully-turned-on state. The voltage Vd and the voltage Vs are respectively applied through the coupled bit lines BL3 and BL4, wherein the bit line BL3 is coupled with the S/D region of the selected cell M31, and the bit line BL4 is coupled with the S/D region of the neighboring cell M32. The S/D region shared by the cells M31 and M32 is floating. The electrons can thus be injected into the charge storage layer by means of the source-side injection and the channel-hot-electron injection.

As shown in FIG. 7, when the charge storage layer of each cell is a charge-trapping layer, two bits (i.e. bit A and bit B) can be stored in a single cell. By tuning the gate voltage Vgb, the channel of the cells M32 can be in the slightly-turned-on state or in the fully-turned-on state or, in the alternative, can be switched from a slightly-turned-on state to a fully-turned-on state, thereby programming the bit A or the bit B or both of the bits A and B in the cell M31.

Furthermore, in order to inhibit the unselected cell M21 in the memory cell set C3, which shares the word lines WL1 and WL2 and bit line BL3 with the memory cell set C5, from being programmed, the voltage Va can be applied to the bit line BL2 adjacent to the bit line BL3. The voltage Va may be equal to 0.5 to 1 times of the voltage Vd.

In the fifth embodiment, if the value of the voltage Va is high enough to form a large difference in voltage between the bit line BL2 and the bit line BL1, the cells M11 may be programmed. In such a case, by applying the voltage Va to both of the bit lines BL2 and BL1 at respective sides of the bit line BL3, the unselected cells M21 and M11 can be inhibited from being programmed.

In the fifth embodiment, if the voltage Va is approximately equal to 0.5 times of the voltage Vd, the difference in voltage between the bit lines BL3 and BL2 and the difference in voltage between the bit lines BL2 and BL1 are both small. Therefore, the unselected cells M21 and M11 can be inhibited from being programmed.

Additionally, in order to inhibit the unselected cell M41 in the memory cell set C7, which shares the word lines WL1 and WL2 and the bit line BL4 with the memory cell set C5, from being programmed, the voltage Vb can be applied to the bit line BL5 adjacent to the bit line BL4. The voltage Vb is, for example, equal to the voltage Vs (e.g. 0V or ground), thereby capable of inhibiting the unselected cell M41 from being programmed. Further, by applying the voltage Vb (e.g. ground) to both of the bit lines BL5 and BL6 at respective sides of the bit line BL4, the unselected cells M41 and M51 can be inhibited from being programmed.

According to the fifth embodiment of the present invention, the method for programming the cell in the memory array may be carried out by setting programming bias shown in Table 3, which is only as an exemplary example.

TABLE 3

|  | bit A | bit B | bits A and B |
| --- | --- | --- | --- |
| WL1 | Vga | Vga | Vga |
| WL2 | Vgb (>X3) | Vgb (>X2 and <X3) | Vgb (X1 to X4) |
| BL3 | Vd | Vd | Vd |
| BL4 | Vs | Vs | Vs |
|  | (0 V or ground) | (0 V or ground) | (0 V or ground) |
| unselected BL1 to BL2 | Va (0.5 to 1 times of Vd) | Va (0.5 to 1 times of Vd) | Va (0.5 to 1 times of Vd) |
| unselected BL5 to BL6 | Vb (0 V or ground) | Vb (0 V or ground) | Vb (0 V or ground) |
| unselected WL3 to WL4 | (0 V or ground) | (0 V or ground) | (0 V or ground) |

Figure 8:
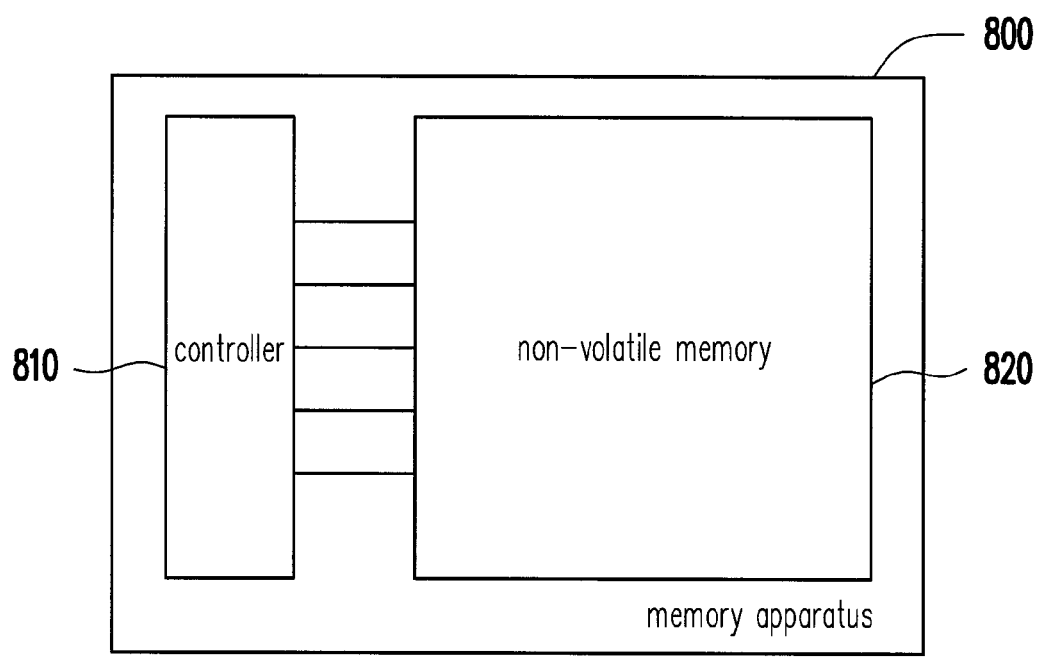
FIG. 8 depicts, in a functional block diagram, a memory apparatus according to a sixth embodiment of the present invention.

FIG. 8 depicts, in a functional block diagram, a memory apparatus according to a sixth embodiment of the present invention.

Referring to FIG. 8, memory apparatus 800 includes a controller 810 (i.e. circuit unit) and a non-volatile memory 820. The cells contained in the non-volatile memory 820 can be programmed by the controller 810 in accordance with the method proposed in the sixth embodiment of the present invention.

In view of the above, since the source-side injection is utilized for programming the cells in the sixth embodiment of the present invention, the bias applied thereto can be lowered, and the programming speed can be enhanced. The sequential combination of the source-side injection and the channel-hot-electron injection is utilized for programming the cells in the sixth embodiment of the present invention, and 4-bit data stored in a single memory cell set can thus be achieved as the memory cell set consists of two cells. The method of the sixth embodiment of the present invention can facilitate the acceleration of the cell programming speed, the enhancement of the device integration, and the improvement of the memory window.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of programming a memory, wherein the memory has a first cell having a first S/D region and sharing a second S/D region with a second cell, and the second cell has a third S/D region opposite to the second S/D region, the method comprising:
    applying a first voltage to a first control gate of the first cell;
    applying a second voltage to a second control gate of the second cell, so as to switch a channel of the second cell from a slightly-turned-on state to a fully-turned-on state;
    applying a third voltage to the first S/D region, floating the second S/D region, and applying a fourth voltage to the third S/D region, wherein carriers flow from the third S/D region toward the first S/D region, so that the carriers are injected into a charge storage layer of the first cell by source-side injection and channel-hot-carrier injection.

2. The method according to claim 1, wherein the method of applying the second voltage to the second control gate of the second cell comprises applying a plurality of voltage pulses with different intensity to the second control gate.

3. The method according to claim 1, wherein the method of applying the second voltage to the second control gate of the second cell comprises applying a triangular voltage pulse to the second control gate.

4. The method according to claim 1, wherein the method of applying the second voltage to the second control gate of the second cell comprises applying a trapezoid voltage pulse to the second control gate.

5. The method according to claim 1, wherein the charge storage layer is a charge-trapping layer, and the carriers are trapped at sites in the charge storage layer of the first cell respectively close to the first S/D region and the second S/D region.

6. A method of programming a cell in a memory array, comprising:
    applying a first voltage to a first control gate of a first cell through a first word line;
    applying a second voltage to a second control gate of a second cell adjacent to the first cell through a second word line, so as to slightly or fully turn on a channel of the second cell, wherein the first cell has a first S/D region and shares a second S/D region with the second cell, and the second cell has a third S/D region opposite to the second S/D region;

applying a third voltage to the first S/D region through a first bit line;

floating the second S/D region;

applying a fourth voltage to the third S/D region through a second bit line, and applying a sixth voltage to a fourth bit line adjacent to the second bit line, so as to inhibit an unselected cell sharing the first word line and the second bit line with the first cell from being programmed, wherein carriers flow from the third S/D region toward the first S/D region, so that the carriers are injected into a charge storage layer of the first cell by source-side injection or channel-hot-carrier injection, wherein the second voltage is equal to a threshold voltage value of the second cell ±5%.

7. The method according to claim 6, wherein the charge storage layer is a charge-trapping layer, and the channel of the second cell is slightly turned on owing to the second voltage, so that the carriers are trapped at a site in the charge storage layer of the first cell close to the second S/D region.

8. The method according to claim 6, wherein the charge storage layer is a charge-trapping layer, and the channel of the second cell is fully turned on, so that the carriers are trapped at a site in the charge storage layer of the first cell close to the first S/D region.

9. The method according to claim 6, wherein the charge storage layer is a charge-trapping layer, and the channel of the second cell is switched-from a slightly-turned-on state to a fully-turned-on state, so that the carriers are trapped at sites in the charge storage layer of the first cell respectively close to the first S/D region and the second S/D region.

10. The method according to claim 6, further comprising:
applying a fifth voltage to a third bit line adjacent to the first bit line, so as to inhibit an unselected cell sharing the first word line and the first bit line with the first cell from being programmed.

11. A memory apparatus, comprising:
a memory array, comprising:
a plurality of cells arranged in a column/row array, and each of the cells comprising a control gate, wherein the cells in a same row are serially connected together respectively by an S/D region to form a memory cell row, as every two neighboring cells are a memory cell set, and the S/D region between the two neighboring cells in the memory cell set is floating; and
a circuit unit connected to the memory array, and at least performing following steps during programming the memory array:
applying a first voltage to a first control gate of a first cell through a first word line;
applying a second voltage to a second control gate of a second cell adjacent to the first cell through a second word line, so as to slightly or fully turn on a channel of the second cell, wherein the first cell has a first S/D region and shares a second S/D region with the second cell, and the second cell has a third S/D region opposite to the second S/D region;

applying a third voltage to the first S/D region through a first bit line;

floating the second S/D region;

applying a fourth voltage to the third S/D region through a second bit line, applying a fifth voltage to a third bit line adjacent to the first bit line, so as to inhibit an unselected cell sharing the first word line and the first bit line with the first cell from being programmed; and applying a sixth voltage to a fourth bit line adjacent to the second bit line, so as to inhibit an unselected cell sharing the first word line and the second bit line with the first cell from being programmed, wherein carriers flow from the third S/D region toward the first S/D region, so that the carriers are injected into a charge storage layer of the first cell by source-side injection or channel-hot-carrier effect, wherein the second voltage is equal to a threshold voltage value of the second cell ±5%.

12. The memory apparatus according to claim 11, wherein the charge storage layer is a charge-trapping layer, and the second voltage is approximately the threshold voltage of the second cell, so that the carriers are trapped at a site in the charge storage layer of the first cell close to the second S/D region.

13. The memory apparatus according to claim 11, wherein the charge storage layer is a charge-trapping layer, and the second voltage is greater than the threshold voltage of the second cell, so that the carriers are trapped at a site in the charge storage layer of the first cell close to the first S/D region.

14. The memory apparatus according to claim 11, wherein the charge storage layer is a charge-trapping layer, and the channel of the second cell is switched from a slightly-turned-on state to a fully-turned-on state, so that the carriers are trapped at sites in the charge storage layer of the first cell respectively close to the first S/D region and the second S/D region.

15. The memory apparatus according to claim 11, wherein the memory array further comprises:
a plurality of word lines arranged in parallel along a column direction, wherein each of the word lines is coupled to the control gates of a column of the cells; and
a plurality of bit lines arranged in parallel along a row direction, wherein, in the same row, the S/D regions serially connecting the memory cell sets are alternately coupled to two bit lines, and two neighboring memory cell rows share one bit line.

\* \* \* \* \*